(12) United States Patent
Freedman et al.

(10) Patent No.: US 9,713,199 B2
(45) Date of Patent: Jul. 18, 2017

(54) TOPOLOGICAL QUBIT FUSION

(71) Applicant: Microsoft Corporation, Redmond, WA (US)

(72) Inventors: Michael H. Freedman, Santa Barbara, CA (US); Zhenghan Wang, Goleta, CA (US); Roman M. Lutchyn, Santa Barbara, CA (US); Chetan Nayak, Santa Monica, CA (US); Parsa Bonderson, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 766 days.

(21) Appl. No.: 13/957,268

(22) Filed: Aug. 1, 2013

(65) Prior Publication Data

US 2014/0221059 A1 Aug. 7, 2014

Related U.S. Application Data

(60) Provisional application No. 61/761,125, filed on Feb. 5, 2013.

(51) Int. Cl.
*H04W 99/00* (2009.01)
*G06N 99/00* (2010.01)
*B82Y 10/00* (2011.01)

(52) U.S. Cl.
CPC ............. *H04W 99/00* (2013.01); *B82Y 10/00* (2013.01); *G06N 99/002* (2013.01)

(58) Field of Classification Search
USPC ....................................................... 455/899
See application file for complete search history.

(56) References Cited

U.S. PATENT DOCUMENTS

| 7,598,514 B2 | 10/2009 | Freedman et al. |
| 8,209,279 B2 | 6/2012 | Freedman et al. |
| 8,275,428 B2 | 9/2012 | Bonderson et al. |
| 2012/0112168 A1 | 5/2012 | Bonderson et al. |

OTHER PUBLICATIONS

Alicea J et al: "Non-Abelian statistics and topological quantum information processing in 1D wire networks", Nature Physics Nature Publishing Group UK, vol. 7, No. 5, May 2011 (May 2011), pp. 412-417.*

Nayak, Chetan; Simon, Steven H.; Stern, Ady; Freedman, Michael; Sarma, Sankar Das (2008). "Non-Abelian Anyons and Topological Quantum Computation". Review of Modern Physics 80 (3): 1083-1159.*

(Continued)

*Primary Examiner* — Yuwen Pan
*Assistant Examiner* — Zhitong Chen
(74) *Attorney, Agent, or Firm* — Klarquist Sparkman, LLP (57) ABSTRACT

A fusion outcome quasiparticle may be trapped in a potential well of a topological segment. The fusion outcome quasiparticle may be the product of fusion of a first quasiparticle and a second quasiparticle, where the first and the second quasiparticles are localized at ends of a topological segment. The potential well having the fusion outcome quasiparticle trapped therein and a third quasiparticle may be moved relative to each other such that the potential well and the third quasiparticle are brought toward each other. The quasiparticles may be Majorana modes of a nanowire.

13 Claims, 5 Drawing Sheets

(56) References Cited

OTHER PUBLICATIONS

Alicea J et al: Nature Physics DOI: 10.1038/NPHYS1915 p. 1-19, Supplementary Material for "Non-Abelian statistics and topological quantum information processing in1D wire networks".*
U.S. Appl. No. 61/761,125, filed Feb. 5, 2013, Freedman et al, titled "Topological Qubit Fusion".
Alicea, Jason, "Majorana Fermions in a Tunable Semiconductor Device", In Journal of Physical Review B, vol. 81, Issue 12, Mar. 15, 2010, 10 pages.
Alicea, et al., "Non-Abelian Statistics and Topological Quantum Information Processing in 1D Wire Networks", In Journal of Nature Physics, vol. 7, Issue 5, Feb. 13, 2011, 23 pages.
Barkeshli, et al., "Structure of Quasiparticles and Their Fusion Algebra in Fractional Quantum Hall States", In Journal of Physical Review B, vol. 79, Issue 19, May 29, 2009, 16 pages.
Bonderson, et al., "Fractional Quantum Hall Hierarchy and the Second Landau Level", In Proceedings of Physical Review B, vol. 78, Issue 12, Article No. 125323, Sep. 15, 2008, 10 pages.
Bonderson, et al., "Implementing Arbitrary Phase Gates with Ising Anyons", In Physical Review Letters, vol. 104, Issue 18, Apr. 2010, 5 pages.
Bonderson, et al., "Plasma Analogy and Non-Abelian Statistics for Ising-type Quantum Hall States", In Proceedings of Physical Review B, vol. 83, Feb. 7, 2011, 68 pages.
Bonesteel, et al., "Braid Topologies for Quantum Computation", In Journal of Physical Review Letters, vol. 95, Issue 14, Sep. 29, 2005, 4 pages.
Bravyi, et al., "Universal Quantum Computation with Ideal Clifford Gates and Noisy Ancillas", In Journal of Physical Review A, vol. 71, Feb. 22, 2005, 14 pages.
Brennen, et al., "Why Should Anyone Care about Computing with Anyons?", In Proceeding of the Royal Society A, Oct. 16, 2007, 25 pages.
Das, et al., "Evidence of Majorana Fermions in an Al—InAs Nanowire Topological Superconductor", In Proceedings of arXiv Preprint arXiv:1205.7073, Jul. 28, 2012, 49 pages.
Deng, et al., "Observation of Majorana Fermions in a Nb—InSb Nanowire-Nb Hybrid Quantum Device", In Proceedings of eprint of arXiv:1204.4130, Apr. 2012, 10 pages.
Eisenstein, et al., "Insulating and Fractional Quantum Hall States in the First Excited Landau Level", In Journal of Physical Review Letter, vol. 88, Issue 7, Feb. 18, 2002, 4 pages.
Fu, et al., "Superconducting Proximity Effect and Majorana Fermions at the Surface of a Topological Insulator", In Journal of Physical Review Letter, vol. 100, Mar. 6, 2008, 4 pages.
Kitaev, A. Yu., "Fault-Tolerant Quantum Computation by Anyons", In Journal of Annals Physics, vol. 303, Issue 1, Jul. 9, 1997, 27 pages.
Kitaev, Alexei Yu., "Unpaired Majorana Fermions in Quantum Wires", In Journal of Physics—Uspekhi, vol. 44, Issue 131, Oct. 2001, 7 pages.
Kumar, et al., "Nonconventional Odd Denominator Fractional Quantum Hall States in the Second Landau Level", In Journal of Physical Review Letter, vol. 105, Issue 24, Dec. 10, 2010, 4 pages.
Lee, et al., "Particle-Hole Symmetry and the v=5/2 Quantum Hall State", In Journal of Physical Review Letter, vol. 99, Issue 23, Dec. 7, 2007, 5 pages.
Levin, et al., "Particle-Hole Symmetry and the Pfaffian State", In Journal of Physical Review Letter, vol. 99, Issue 23, Dec. 6, 2007, 5 pages.
Lutchyn, et al., "Majorana Fermions and a Topological Phase Transition in Semiconductor-Superconductor Heterostructures", In Journal of Physical Review Letter, vol. 105, Issue 7, Aug. 13, 2010, 5 pages.
Moore et al., "Nonabelions in the Fractional Quantum Hall Effect", Nuclear Physics B, 1991, 360(2-3), 362-396.
Mourik, et al., "Signatures of Majorana Fermions in Hybrid Superconductor-Semiconductor Nanowire Devices", In Journal of Science, vol. 336, Issue 6084, Apr. 5, 2012, 28 pages.
Nayak, et al., "Non-Abelian Anyons and Topological Quantum Computation", In Journal of Reviews of Modern Physics, vol. 80, Issue 3, Sep. 12, 2008, 73 pages.
Oreg, et al., "Helical Liquids and Majorana Bound States in Quantum Wires", In Journal of Physical Review Letter, vol. 105, Issue 17, Oct. 20, 2010, 5 pages.
Pachos, Jiannis K., "Introduction to Topological Quantum Computation", Published on: May 25, 2012, Available at: http://www1.quantum.leeds.ac.uk/~phyjkp/index_files/JiannisPachosLecture.pdf, 41 pgs.
Pan, et al., "Exact Quantization of Even-Denominator Fractional Quantum Hall State at v=5/2 Landau Level Filling Factor", In Journal of Physical Review Letter, vol. 83, Issue 17, Oct. 25, 1999, 5 pages.
Radu, et al., "Quasiparticle Tunneling in the Fractional Quantum Hall State at v=5/2", In Journal of Science, vol. 320, Issue 5878, May 16, 2008, 6 pages.
Read, et al., "Paired States of Fermions in Two Dimensions with Breaking of Parity and Time-Reversal Symmetries, and the Fractional Quantum Hall Effect", In Journal of Physical Review B, vol. 61, Issue 15, Apr. 2000, 35 pages.
Rokhinson, et al., "Observation of the Fractional a.c. Josephson Effect and the Signature of Majorana Particles", In Journal of Nature Physics, vol. 8, Issue 11, Aug. 23, 2012, 17 pages.
Sau, et al., "A Generic New Platform for Topological Quantum Computation using Semiconductor Heterostructures", In Journal of Physical Review Letter, vol. 104, Issue 4, Jan. 27, 2010, 4 pages.
Volovik, G.E., "Monopole, Half-Quantum Vortices and Nexus in Chiral Superfluids and Superconductors", In Journal of Experimental and Theoretical Physics Letters, vol. 70, Issue 12, Dec. 25, 1999, 4 pages.
Willett, et al., "Magnetic Field Induced Resistance Properties at Filling Factor 5/2 Consistent with Non-Abelian e/4 Quasiparticles in Multiple Sized Interferometers", retrieved from eprint of arXiv:1204.1993, Apr. 2012, 18 pages.
Willett, et al., "Measurement of Filling Factor 5/2 Quasiparticle Interference: Observation of e/4 and e/2 Period Oscillations", In Proceeding of the National Academy Sciences, vol. 106, Issue 22, Jun. 2, 2009, 26 pages.
Willett et al., "Observation of an Even-Denominator Quantum in the Fractional Quantum Hall Effect", Physical Review Letters, Oct. 12, 1987, 59(15), 1776-1779.
Xia, et al., "Electron Correlation in the Second Landau Level; A Competition between Many, Nearly Degenerate Quantum Phases", In Journal of Physical Review Letter, vol. 93, Issue 17, Oct. 22, 2004, 5 pages.
Written Opinion of the International Preliminary Examining Authority from International Application No. PCT/US2014/014748, dated Jun. 24, 2015, 9 pages.
International Preliminary Report on Patentability from International Application No. PCT/US2014/014748, dated Sep. 16, 2015, 15 pages.
International Search Report and Written Opinion for International Application No. PCT/US2014/014748, dated May 13, 2014, 15 pages.
Jiang, et al., "Unconventional Josephson Signatures of Majorana Bound States," Physical Review Letters, 107:1-6 (Dec. 2011).
Alicea, "New directions in the pursuit of Majorana fermions in solid state systems," Reports on Progress in Physics, 75:1-36 (Jun. 2012).
Alicea et al., "Non-Abelian statistics and topological quantum information processing in 1D wire networks," APS Meeting Abstracts, pp. 1-23 (Sep. 19, 2010).
Notice on the First Office Action from Chinese Application No. 201480007403.7, dated Mar. 3, 2017, 16 pages (with English translation).

* cited by examiner

TOPOLOGICAL QUBIT FUSION

CROSS REFERENCE TO RELATED PATENT APPLICATIONS

This application claims the benefit of U.S. Provisional Application No. 61/761,125, filed Feb. 5, 2013, which application is hereby incorporated in its entirety by reference.

BACKGROUND

A number of experiments provide evidence supporting the existence of topological phases of matter with non-Abelian anyonic quasiparticles. Ising-type σ nonAbelian anyons occur as quasiparticles in a number of quantum Hall states that are strong candidates for describing experimentally observed quantum Hall plateaus in the second Landau level, most notably for the v=5/2 plateau, which has experimental evidence favoring a non-Abelian state. Ising anyons also describe the Majorana fermion zero modes (MZMs) which exist in vortex cores of two-dimensional (2D) chiral p-wave superfluids and superconductors, at the ends of Majorana nanowires (one-dimensional spinless, p-wave superconductors), and quasiparticles in various proposed superconductor heterostructures. Recent experiments in superconductor/semiconductor nanowire heterostructure systems have found evidence of MZMs and hence realization of Majorana.

Non-Abelian anyonic quasiparticles may be used to provide topologically protected qubits and quantum information processing. Schemes for implementing fusion, (braiding) exchange operations, and topological charge measurements of non-Abelian quasiparticles have previously been disclosed.

In systems with Ising-type anyons/MZMs, quasiparticle exchange and topological charge measurement allow these systems to be used for topological quantum information processing. Braiding and measurement in these systems allow the topologically protected generation of the Clifford gates, which is not a computationally universal gate set. To make these systems universal quantum computers, it is sufficient to supplement the gate set with a "θ/2-phase gate", $R(\theta) = \text{diag}[1, e^{i\theta}]$ (where $\text{diag}[1, e^{i\theta}]$ represents a 2×2 matrix in which off diagonal elements are zero ($r_{12}=r_{21}=0$) and elements $r_{11}=1$ and $r_{22}=e^{i\theta}$) (in some instances, $R(\theta)$ may be written as $R(\theta)$), with $\theta \neq n\pi/2$ (for n an interger). A particularly propitious choice for this is to use the π/8-phase gate, $T = R(\pi/4)$, which can be generated if one has a supply of prepared or "magic states," such as $$\left|B_{\frac{\pi}{4}}\right\rangle = \cos\left(\frac{\pi}{8}\right)|0\rangle - i\sin\left(\frac{\pi}{8}\right)|1\rangle.$$

This is an advantageous choice because it is known how to "distill" magic states, i.e. produce a higher fidelity state from several noisy copies of the state, using only Clifford operations, for a remarkably high error threshold of approximately 0.14 for the noisy states.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Overview

A useful, but, thus far, overlooked topologically protected computational operation (which is disclosed herein) is the fusion of two (or more) topological qubits. "Topological qubit fusion" is an operation acting on two (or more) topological qubits that results in one fewer topological qubit and a new state for the remaining qubit(s). This operation is performed by fusing a number of the anyonic quasiparticles which comprise these qubits, measuring the resulting fusion outcomes, and fusing these resulting fusion outcomes with other quasiparticles that comprised the qubits. (This will be explained in more detail.) Quasiparticle fusion operations and measurement operations have not been previously utilized to produce the topological qubit fusion operation discussed herein. It is important to be able to measure the anyonic fusion outcomes in order to avoid producing mixed states, i.e. introducing decoherence in the resulting states, when performing this operation.

While fusion of MZMs has been discussed in the context of Majorana wires, a method of trapping and measuring the fusion outcome (I or ψ) when fusing two segments of Majorana wires into one segment has not previously been proposed. Also described herein is a proposal for doing so by: (1) trapping the fusion outcome in a "wire well;" (2) observing whether or not the well is occupied (by a ψ excitation) through local measurements; and (3) fusing any resulting trapped ψ excitation with a MZM by either (a) adiabatically moving the well to a prescribed end of the resulting wire segment or (b) adiabatically moving a prescribed end of the wire to the well.

As an illustration of the utility of the topological qubit fusion operation, a novel protocol is described using topological qubit fusion for implementing a θ/2-phase gate, R(θ), on a topological qubit comprised of MZMs/Ising σ quasi-particles, given an ancillary topological qubit in the state $|B_\theta\rangle = \cos(\theta/2)|0\rangle - i\sin(\theta/2)|1\rangle$.

Previously disclosed proposals for generating a π/8-phase gate from a magic state (or, more generally, a θ/2-phase gate from a state such as $|B_\theta\rangle$) employed the use of entangling gates (such as CNOT gates) and/or non-demolitional entangling two qubit measurements (such as parity measurements). The protocol discussed herein for converting $|B_\theta\rangle$ states into θ/2-phase gates using topological qubit fusion has the advantage that it is natural in the anyonic context and does not require performing any entangling gate operations nor non-demolitional entangling two-qubit measurements, which require more difficult interferometric measurements of the collective topological charge of four (or more) quasiparticles, which may be difficult operations to produce (with error protection).

Figure 1:
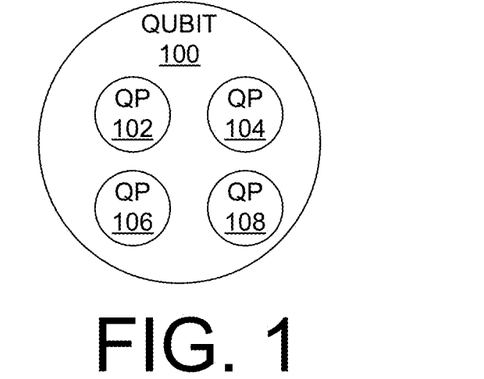
FIG. 1 is a schematic diagram of an illustrative qubit encoded with four quasiparticles.

Using MZMs/Ising-type quasiparticles, as one non-limiting example, a topological qubit 100 in the "standard encoding" is comprised of four MZMs/Ising a quasiparticles 102-108, whose collective topological charge is trivial (i.e., even fermion parity/vacuum topological charge I), as shown in FIG. 1.

Figure 2:
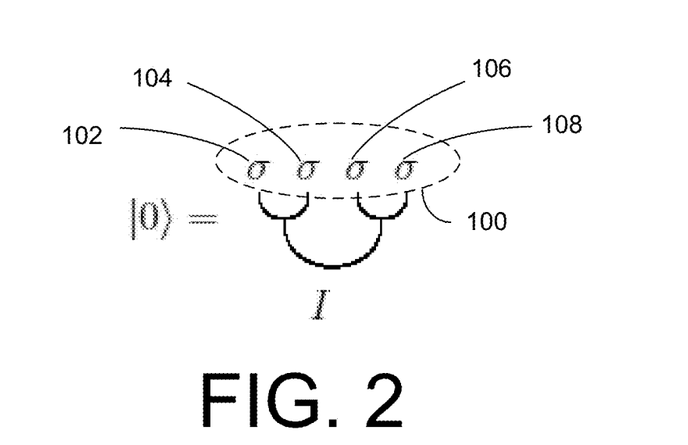
FIG. 2 is a schematic diagram of an illustrative fusion tree of a |0⟩ basis state.
Figure 3:
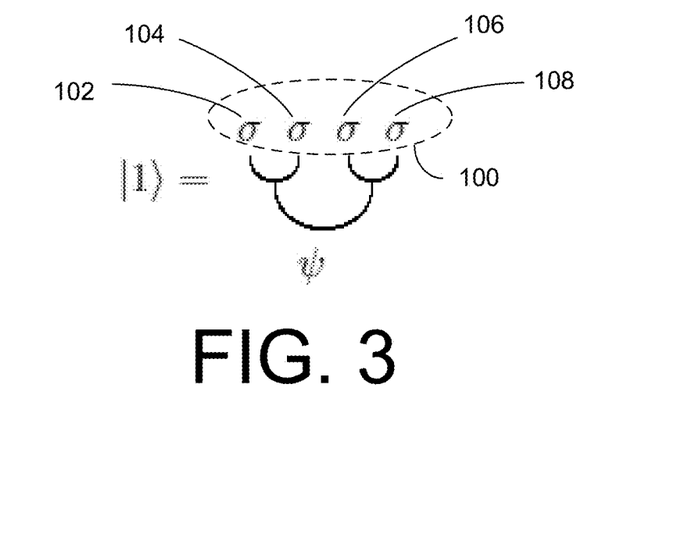
FIG. 3 is a schematic diagram of an illustrative fusion tree of a $\sqrt[3]{1}$⟩ basis state.

A fusion tree for the $|0\rangle$ basis state and the $|1\rangle$ state of the qubit 100 is illustrated in FIGS. 2 and 3, respectively. The $|0\rangle$ basis state is given by the state in which quasiparticles 102 and 104 are in the I fusion channel and quasiparticles 106 and 108 are also in the I fusion channel. The $|1\rangle$ basis state of the qubit 100 is given by the state in which quasiparticles 102 and 104 are in the ψ fusion channel and quasiparticles 106 and 108 are also in the ψ fusion channel.

Figure 4:
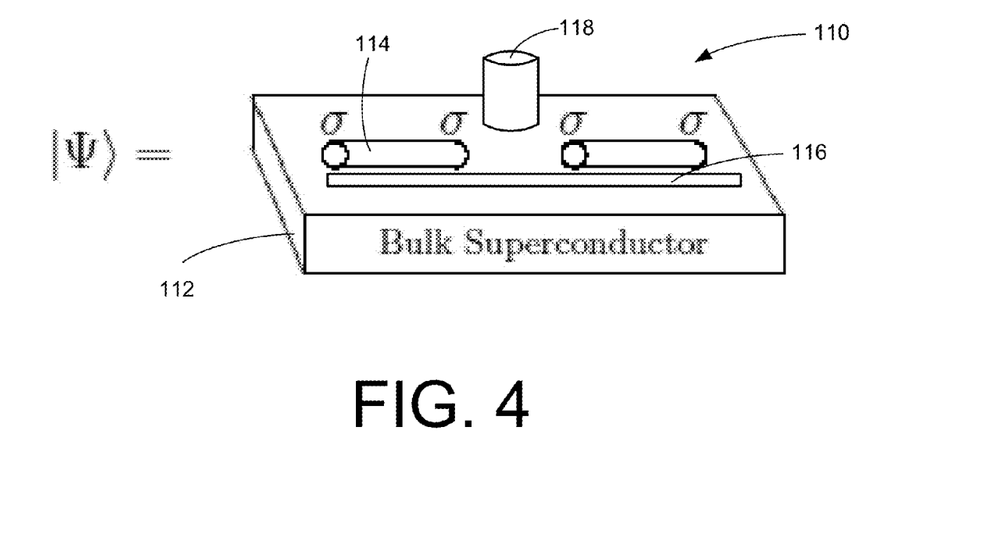
FIG. 4 is a schematic diagram of an illustrative topological system.

Referring to FIG. 4, a topological system 110 for σ quasiparticles is illustrated. A superconductor 112, such as an s-wave superconductor, has a plurality of nanowires 114 disposed thereon. The heterostructure system, i.e., the combined nanowires 114 and the superconductor 112, may be tuned (using for example, electrostatic gates or local magnetic fields) so that the nanowires 114 (or segments thereof) are driven into the topological (p-wave superconducting) phase. A segment of nanowire in the topological phase is referred to as a "Majorana wire." In Majorana wires the a quasiparticles represent the MZMs localized at the endpoints of topological regions of wire and a topological qubit (in the standard encoding) is comprised of two segments of Majorana wire, as indicated schematically in FIG. 4. The basis states $|0\rangle$ and $|1\rangle$ of the qubit are given by the states in which each of the wire segments has even and odd fermion parity, respectively.

The topological system 110 may also include an array of gates 116. The array of gates 116 may provide, among other things, electrical potential or a magnetic field. In this manner, the array of gates 116 may induce the nanowires 114 to change between topological phase and nontopological, normal or "trivial" phase, and vice-versa.

The topological system 110 may also include a measuring device 118 such as an interferometer that may measure quasiparticles. For example, the measuring device 118 may measure fusion outcomes to determine whether the fusion outcomes are I or ψ fusion outcomes.

The processes and systems described herein may be implemented in a number of ways. Example implementations are provided below with reference to the following figures.

Topological Qubit Fusion

Topological Qubit Fusion may be generally described to be an operation acting on two (or more) topological qubits that results in one fewer topological qubit and a new state for the remaining qubit(s). This operation is performed by fusing a number of the anyonic quasiparticles which comprise these qubits, measuring the resulting fusion outcomes, and fusing these resulting fusion outcomes with other quasiparticles that comprised the qubits.

The resulting operation, i.e., the map from the initial state to the final state, will generally depend on the type of anyonic quasiparticles being used and the choice of which quasiparticles are fused. To describe this in more detail, consider, as one concrete but non-limiting example, Ising-type anyons (or MZMs). Start with two topological qubits (in the standard encoding): $|\Psi_A\rangle = \alpha_0|0\rangle + \alpha_1|1\rangle$ and $|\Psi_B\rangle = \beta_0|0\rangle + \beta_1|1\rangle$, and perform the topological qubit fusion operation shown in FIG. 5.

Figure 5:
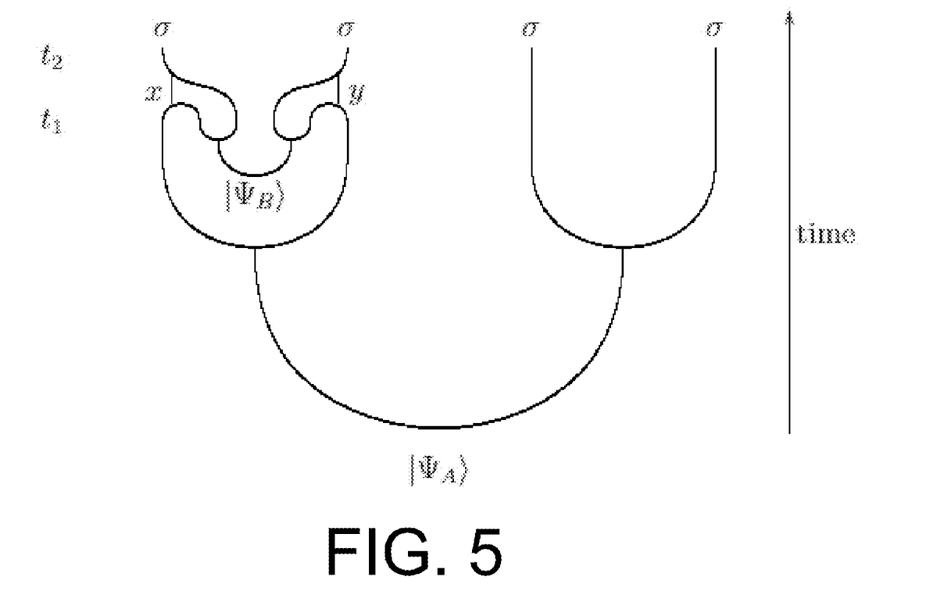
FIG. 5 is an illustrative fusion tree diagram representing a qubit fusion.

At time t0, qubit A is comprised of quasiparticles A1, A2, A3, and A4, and qubit B is comprised of quasiparticles B1, B2, B3, and B4.

At time t1, quasiparticles A1 and B1 are fused, resulting in the quasiparticle x (which can be either I or ψ), and quasiparticles A2 and B4 are fused, resulting in quasiparticle y (which can be either I or ψ). The topological charge values I or ψ of quasiparticles x and y are measured. Then at time t2, quasiparticle x is fused with quasiparticle B2, which results in a σ quasiparticle and is the new quasiparticle 1 of the final topological qubit, and quasiparticle y is fused with quasiparticle B3, which results in a σ quasiparticle and is the new quasiparticle 2 of the final topological qubit. $N_{xy}$ is defined to equal 0 when x⊗y=I and equal 1 when x⊗y=ψ (i.e. it is the fermion parity of the fusion outcomes). Then this topological qubit fusion operation is given by $$|\Psi_A\rangle \otimes |\Psi_B\rangle \mapsto |\Psi\rangle = \frac{\alpha_0[\beta_0 + (-1)^{N_{xy}}\beta_1]|0\rangle + \alpha_1[\beta_0 - (-1)^{N_{xy}}\beta_1]|1\rangle}{\sqrt{|\alpha_0[\beta_0 + (-1)^{N_{xy}}\beta_1]|^2 + |\alpha_1[\beta_0 - (-1)^{N_{xy}}\beta_1]|^2}}.$$

Figure 6:
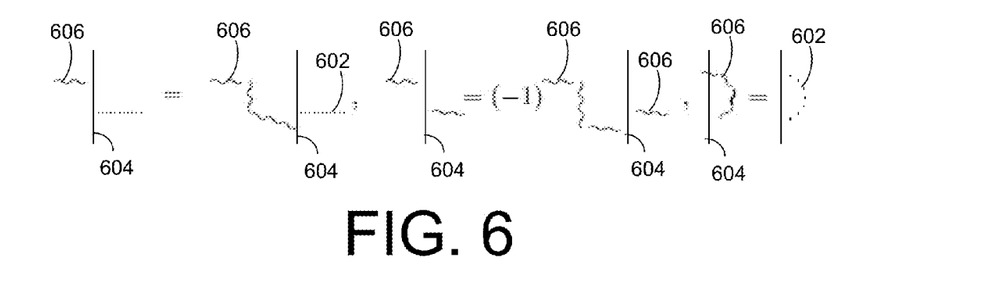
FIG. 6 shows illustrative diagrammetric rules (fusion "F-moves") for quasi particles.

This result was obtained using the F-moves and bubble contractions depicted in FIG. 6, where a dotted line 602, a solid line 604, and a squiggly line 606 represent world lines for I, σ, and ψ, respectively.

One can fuse the quasiparticles in a different manner to produce different topological qubit fusion operations. For example, if one were to fuse quasiparticle A2 of qubit A with quasiparticle B1 of qubit B to give x which is subsequently fused with quasiparticle B2 of qubit B, and also fuse quasiparticle A3 of qubit A with quasiparticle B4 of qubit B to give y which is subsequently fused with quasiparticle B3 of qubit B, the operation would be $$|\Psi_A\rangle \otimes |\Psi_B\rangle \mapsto |\Psi'\rangle =$$

$$\frac{[\alpha_0\beta_0 + (-1)^{N_{xy}}\alpha_1\beta_1]|0\rangle + [\alpha_1\beta_0 + (-1)^{N_{xy}}\alpha_0\beta_1]|1\rangle}{\sqrt{|[\alpha_0\beta_0 + (-1)^{N_{xy}}\alpha_1\beta_1]|^2 + |[\alpha_1\beta_0 + (-1)^{N_{xy}}\alpha_0\beta_1]|^2}}.$$

Phase Gates Generated Via Topological Qubit Fusion

It is straightforward to check that the topological qubit fusion operations for Ising-type quasiparticles described in the previous section can be used to generate unitary operator acting on one of the qubits through a judicious choice of the other qubit. In particular, assume $|\Psi_B\rangle = |B_\theta\rangle$ (as previously defined), then the first topological qubit fusion procedure (shown in FIG. 5) results in the operation $$|\Psi_A\rangle \otimes |B_\theta\rangle \mapsto |\Psi\rangle =$$

$$\alpha_0 \exp\left[-i(-1)^{N_{xy}}\frac{\theta}{2}\right]|0\rangle + \alpha_1 \exp\left[i(-1)^{N_{xy}}\frac{\theta}{2}\right]|1\rangle = R[(-1)^{N_{xy}}\theta]|\Psi_A\rangle$$

(the last equality is up to an unimportant overall phase factor). Thus, topological qubit fusion can be used with states $|B_\theta\rangle$ in this manner to generate the θ/2-phase gates, R(θ) on another qubit. If $N_{xy}=0$, this immediately follows from the above. If $N_{xy}=1$, then this will generate the conjugate $-\theta/2$-phase gates. This poses no problem, as long as one knows the values of x and y, one can make subsequently alterations to the quantum computation to correct for the difference. For example, if one is using magic states to generate π/8-phase gates, R(π/4), and has $N_{xy}=1$, then the resulting R(−π/4) gate can be followed by a R(π/2) phase gate, which is a Clifford gate that can be obtained by braiding a quasiparticles.

Exemplary Implementation

Majorana wires are regions within semiconductor wires with strong spin-orbit coupling in which proximity to an s-wave superconductor has induced an effective p-wave pairing of electrons with gap $\Delta_0$. The fundamental inequality that dictates which regions of the wire are in the topological (Majorana) phase states:

$|V_z| > \sqrt{\mu^2 + \Delta_0^2}$ is the topological regime, and $|V_z| < \sqrt{\mu^2 + \Delta_0^2}$ is the normal or "trivial" phase, and where $V_x$ is the Zeeman splitting and μ is the chemical potential.

All quantities in the above formula can be spatially adjusted with local electric or magnetic fields and are therefore amenable to (time-dependent) gating and control.

Using either electrical or magnetic gating or both, two segments of a wire in the topological regime may be extended until they join into a single segment. As the segments join, the fusion rules of the Ising tensor category governing the long-range physics allow two distinct fusion outcomes: σ⊗σ=I⊕ψ, where I is the trivial/vacuum quasiparticle and ψ is a fermion. To avoid decoherence, it is necessary to measure which outcome occurs upon fusion and, if the outcome is ψ, to control (or at least know) what happens to the resulting ψ quasiparticle. A ψ outcome will be trapped by a potential well, which is created, for example, by a kink in the chemical potential μ.

Fortunately, ψ is an excitation above the ground state and, for typical system parameters, will have an additional energy of order of 10 meV. With careful calibration the control gate potentials required to fuse two topological segments of a given wire will be bimodal and can be used to read out the fusion outcome: I (lower energy) or ψ (higher energy).

The topological segments are fused as a result of changing parameters $V_x$, μ, and/or $\Delta_0$. It is possible to control these parameters in such a way that a spatially localized potential well is formed at and shortly after the moment of fusion. This well will trap the fusion outcome (which is only relevant if the outcome happens to be ψ). This is particularly obvious if fusion occurs via gating which increases μ while leaving the other parameters substantially constant; μ will be lower, initially in the region where fusion is incipient. Item (1) of the Overview section amounts to controlling gating to maintain this well and hence the localization of any fusion outcome ψ.

Finally, by sequentially adjusting gates along the wire, as in playing a scale on the piano, the well may be migrated adiabatically to either the left or the right end of the newly formed, unified topological segment of wire. Alternatively, the gates along the wire may be adjusted to adiabatically translate one of the endpoints of the wire to the well. When the well and desired endpoint become close to each other (i.e., within a few coherence lengths), the ψ quasiparticle, if present, will fuse with the σ quasiparticle localized at the Majorana wire endpoint (lowering the system energy back to the ground state).

Figure 7:
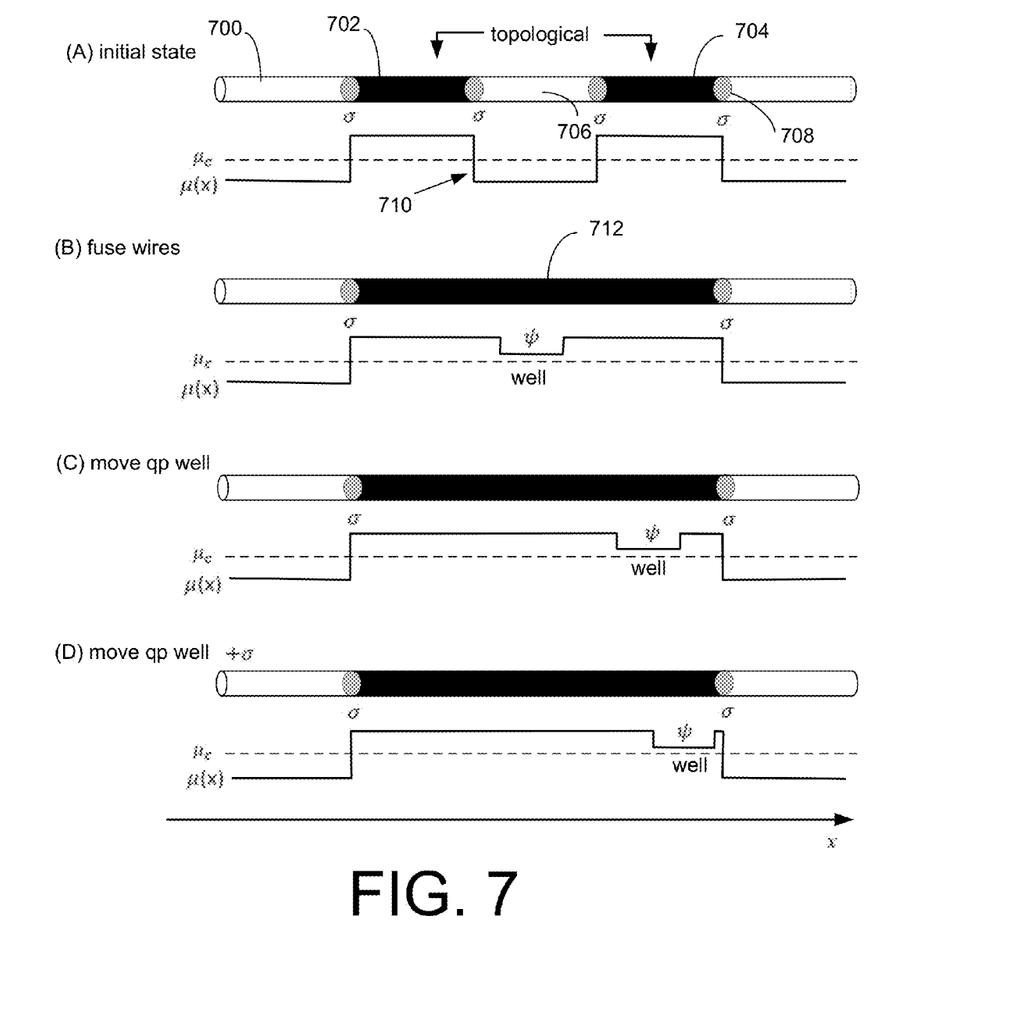
FIG. 7 is a flow diagram of an illustrative topological fusion process showing wire segments (in topological and non-topological phases) with their corresponding chemical potential profiles.

FIG. 7 illustrates a topological fusion process. A nanowire 700 has topological regions 702 and 704 and non-topological region 706 interposing regions 702 and 704. a quasiparticles 708 are located at the ends of the topological regions 702 and 704. A potential well 710 is formed from the non-topological region 706.

The nanowire 700 is tuned such that proximal ends of the topological regions 702 and 704 extend towards each other to form a single topological region 712. The potential well 710 traps the fusion outcome ψ (or I).

The nanowire 700 is further tuned such that the potential well 710 is adiabatically moved toward an end of the topological region 712, where a a particle is localized. As the potential well 710 is brought into proximity of the end of the topological region 712, the fusion outcome ψ tunnels through the potential barrier and the fusion outcome ψ fuses with the a quasiparticle.

The fusion of topological segments may be effectively described in terms of the Majorana operators located near the ends of each topological segment. (See, FIG. 8.)

Figure 8:
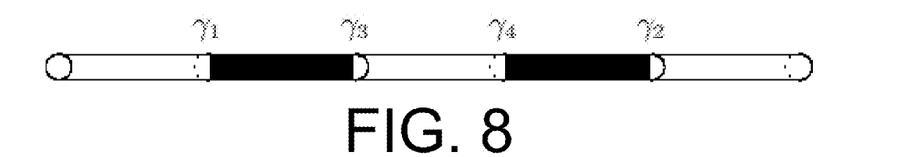
FIG. 8 is a schematic representation of illustrative topological segments of nanowire in the context of Majorana operators.

The fermion $\psi(x)=y_3(x)+iy_4(x)$ is not spatially localized and has an interaction with $y_1$ and $y_2$ of the $\psi y_1 + i\psi y_2$. ψ will be concentrated near the (normal state) Fermi surface and may be written as $\psi = \psi_{kF}$.

After fusion the system Hamiltonian will take an effective form $H = it_{13}y_1y_3 + it_{42}y_4y_2 + it_{34}y_3y_4$ where all $t_{ij}$ are real.

Exemplary Phase Gate

A non-limiting implementation of the topological qubit fusion protocol shown in FIG. 5, which may be used to convert states $|B_\theta\rangle$ into θ/2-phase gates, R(θ), for Majorana wires is discussed below with respect to FIGS. 9A-9E.

Figure 9A:
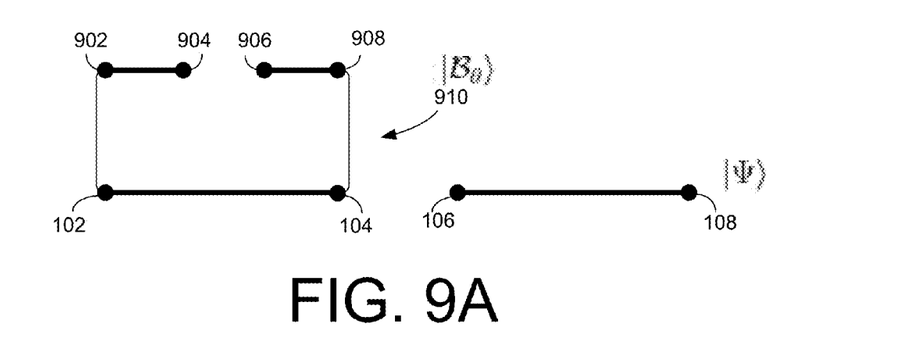
FIGS. 9A-9E are schematic illustrations of an exemplary phase gate.

FIG. 9A shows a computational qubit comprised of quasiparticles 102, 104, 106 and 108 in state |Ψ⟩ and an ancillary qubit comprised of quasiparticles 902, 904, 906, and 908 is state $|B_\theta\rangle$. The quasiparticles 102, 104 and 902-908 are localized at ends of Majorana wires (or topological regions) of a nanowire 910. Portions of the nanowire 910 shown in a thick line (between 102 and 104, between 902 and 904, and between 906 and 908) are in topological phase, and portions of the nanowire 910 shown in a narrow line (between 102 and 902 and between 104 and 908) are in normal, nontopological or "trivial" phase.

Figure 9B:
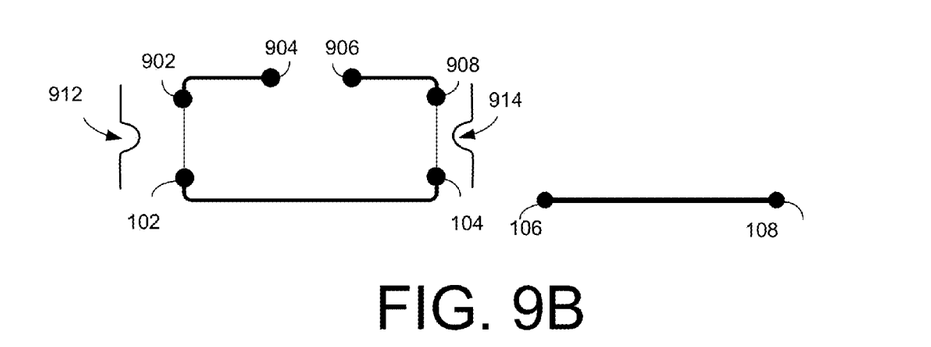

FIG. 9B shows potential wells 912 and 914 are formed in the nanowire 910 between quasiparticles 102 and 902 and quasiparticles 104 and 908, respectively. The potential wells 912 and 914 are formed from the nontopological or normal phase of the nanowire 910. The nanowire 910 is tuned such that segments of the nanowire 910 between the quasiparticles 102 and 902 and the quasiparticles 104 and 908 enter topological phase, thereby moving quasiparticles 102 and 902 towards each other and quasiparticles 104 and 908 towards each other, and forming the respective potential wells 912 and 914.

Figure 9C:
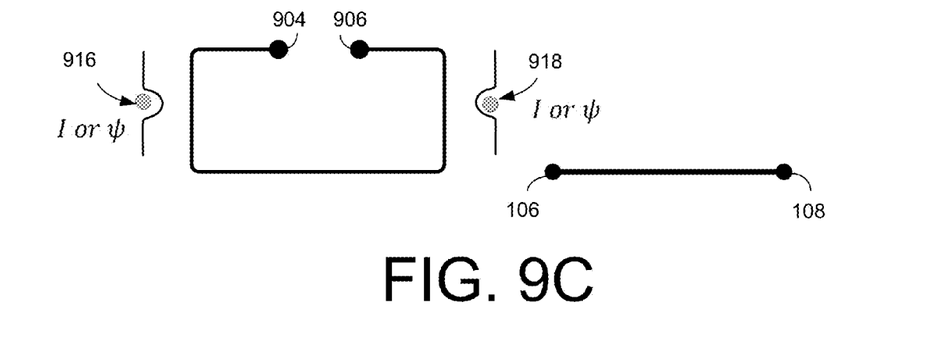

FIG. 9C shows the nanowire 910 being in topological phase and having the potential wells 912 and 914 formed therein. The potential wells 912 and 914 have trapped fusion outcomes 916 and 918, respectively. The fusion outcomes (I or ψ) trapped in the resulting potential wells 916 and 918 are detected using local energy measurements. The fusion outcomes are recorded.

Figure 9D:
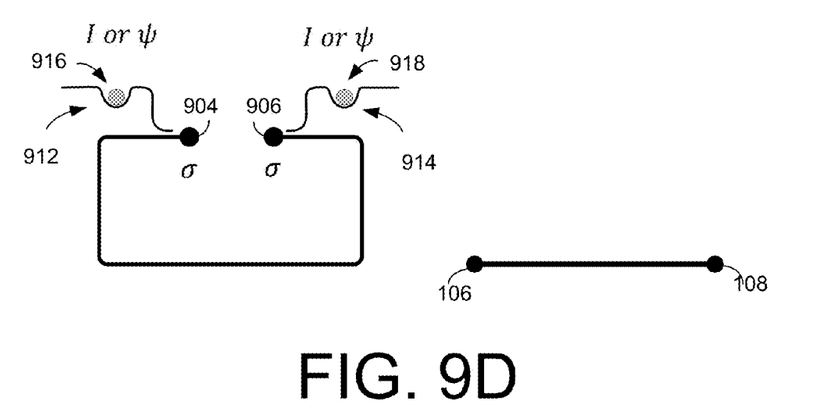

FIG. 9D shows the potential wells 912 and 914 with trapped fusion outcomes 916 and 918, respectively, which may be adiabatically slid (this may be done by "playing the scale" on the control gates) towards specified wire endpoints where the quasiparticles 904, 906 are localized. When the potential wells 912 and 914 are close enough to the quasiparticles 904 and 906, respectively, quantum tunneling may occur if one or both of the trapped fusion outcomes 916 and 918 are ψ quasiparticles. The quasiparticles 904 and 906 are σ quasiparticles (MZMs).

Figure 9E:
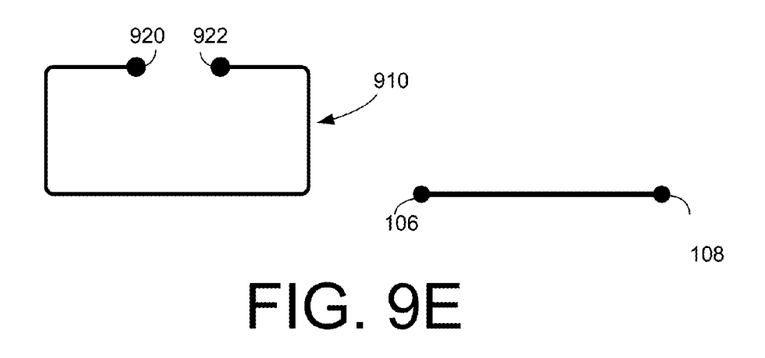

FIG. 9E shows the nanowire 910 in topological phase after the trapped fusion outcomes 916 and 918 have fused with quasiparticles 904 and 906, respectively, to yield quasiparticles 920 and 922, respectively. The quasiparticles 106, 108, 920 and 922 may comprise a new topological qubit.

This achieves the θ/2-phase gate R(θ) if $N_{xy}=0$ or the conjugate −θ/2 phase gate R(−θ) if $N_{xy}=1$. If using θ=π/4, a subsequent braiding operation can be applied to convert R(−π/4) to R(π/4), if necessary.

Conclusion

Although the techniques have been described in language specific to structural features and/or methodological acts, it is to be understood that the appended claims are not necessarily limited to the specific features or acts described. Rather, the specific features and acts are disclosed as exemplary forms of implementing such techniques.

The various embodiments described above can be combined to provide further embodiments.

The invention claimed is:

1. A method of providing a topological quantum computing operation, comprising:
   providing a first quasiparticle and a second quasiparticle respectively localized at first and second ends of a first topological wire segment defined by a first chemical potential;
   providing a third quasiparticle and a fourth quasiparticle respectively localized at first and second ends of a second topological wire segment defined by a second chemical potential;
   forming a potential well at a nontopological phase wire segment that extends between the first topological wire segment and the second topological wire segment; and
   fusing in the potential well the second and third quasiparticles together in a manner that traps a fusion outcome quasiparticle resulting from the fusion of the second and third quasiparticles in the potential well.

2. The method of claim 1, wherein prior to fusing, the method further comprising:
   turning the nontopological phase wire segment into a topological phase wire segment such that at least one of the second quasiparticle and the third quasiparticle moves toward the other.

3. The method of claim 2, wherein turning the nontopological phase regions into topological phase regions and forming the potential well therein comprises adjusting a number of gates to drive phase changes in a nanowire that comprises the first and second topological wire segments and the nontopological phase wire segment.

4. The method of claim 1, further comprising: measuring the fusion outcome quasiparticle.

5. The method of claim 1, further comprising:
   bringing the potential well having the fusion outcome quasiparticle trapped therein and the first end of the first topological wire segment toward each other.

6. The method of claim 5, wherein bringing the potential well having the fusion outcome quasiparticle trapped therein and the first end of the first topological wire segment toward each other further comprises at least one of: (a) driving the potential well having the fusion outcome quasiparticle trapped therein toward the first end of the first topological wire segment; and (b) driving the first end of the first topological wire segment toward the potential well having the fusion outcome quasiparticle trapped therein.

7. The method of claim 1, wherein the fusion outcome quasiparticle is a first fusion outcome quasiparticle, the method further comprising:
   fusing the first quasiparticle and the first fusion outcome quasiparticle together to yield a second fusion outcome quasiparticle.

8. The method of claim 7, wherein an initial first qubit comprises at least the first and second quasiparticles, and an initial second qubit comprises the third and fourth quasiparticles and at least a fifth quasiparticle, the method further comprising: forming a third qubit with at least the second fusion outcome quasiparticle and the fifth quasiparticle.

9. The method of claim 1, wherein the first topological wire segment is a Majorana wire.

10. A quantum computing device, comprising:
    a nanowire configurable to have a first topological segment and a second topological segment and a nontopological segment, each topological segment having first and second ends and having a respective quasiparticle localized thereat, the nontopological segment extending between the first ends of the first and second topological segments; and
    an array of gates configured to selectively induce changes of phase, from topological to nontopological and vice-versa, in the nanowire and configured to induce a potential well in the nanowire at the nontopological segment that traps a fusion outcome quasiparticle therein, the fusion outcome quasiparticle being the product of fusion of quasiparticles localized at the first ends of the first and the second topological segments, wherein gates of the array of gates are selectable so as to turn the nontopological phase wire segment into a topological phase wire segment such that at least one of the second quasiparticle and the third quasiparticle moves toward the other.

11. The quantum computing device of claim 10, wherein the nanowire comprises a Majorana wire.

12. The quantum computing device of claim 10, wherein the array of gates is further configured to cause relative motion of the potential well such that the potential well and the second end of the first topological segment are brought towards each other.

13. The quantum computing device of claim 10, further comprising:
    a measurement device for measuring the fusion outcome quasiparticle.

* * * * *